US009991343B2

(12) United States Patent
Tsai

(10) Patent No.: US 9,991,343 B2
(45) Date of Patent: Jun. 5, 2018

(54) LDD-FREE SEMICONDUCTOR STRUCTURE AND MANUFACTURING METHOD OF THE SAME

(71) Applicant: TAIWAN SEMICONDUCTOR MANUFACTURING COMPANY LTD., Hsinchu (TW)

(72) Inventor: Chun Hsiung Tsai, Hsinchu County (TW)

(73) Assignee: TAIWAN SEMICONDUCTOR MANUFACTURING COMPANY LTD., Hsinchu (OM)

(*) Notice: Subject to any disclaimer, the term of this patent is extended or adjusted under 35 U.S.C. 154(b) by 6 days.

(21) Appl. No.: 14/632,465

(22) Filed: Feb. 26, 2015

(65) Prior Publication Data

US 2016/0254351 A1 Sep. 1, 2016

(51) Int. Cl.

*H01L 29/15* (2006.01)
*H01L 29/08* (2006.01)

(Continued)

(52) U.S. Cl.

CPC .......... *H01L 29/0847* (2013.01); *H01L 29/36* (2013.01); *H01L 29/66636* (2013.01);

(Continued)

(58) Field of Classification Search

CPC ........... H01L 29/1608; H01L 29/66636; H01L 29/7848; H01L 21/823431;

(Continued)

(56) References Cited

U.S. PATENT DOCUMENTS 7,510,925 B2 * 3/2009 Miyanami ............. H01L 29/165 257/E21.177
8,022,488 B2 * 9/2011 Cheng ................... H01L 29/165 257/335

(Continued)

FOREIGN PATENT DOCUMENTS

| TW | 201411841 | 3/2014 |
|---|---|---|
| TW | 201445618 | 12/2014 |
| TW | 201507756 | 2/2015 |

OTHER PUBLICATIONS

English abstract translation of TW 201507156.

(Continued)

*Primary Examiner* — Jesse Y Miyoshi
*Assistant Examiner* — Tuan A Hoang
(74) *Attorney, Agent, or Firm* — WPAT, P.C., Intellectual Property Attorneys; Anthony King

(57) ABSTRACT

The present disclosure provides an LDD-free semiconductor structure including a semiconductor layer, a gate over the semiconductor layer and a regrowth region made of semiconductor material positioned in the semiconductor layer. The regrowth region forms a source region or a drain region of the LDD-free semiconductor structure. The gate includes a gate electrode layer laterally covered by a gate spacer. The regrowth region extends towards a region beneath the gate spacer and close to a plane extending along a junction of the gate spacer and the gate electrode layer. The present disclosure also provides a method for manufacturing an LDD-free semiconductor structure. The method includes forming a gate over a semiconductor layer, removing a portion of the semiconductor layer and obtaining a recess, and forming a regrowth region over the recess.

17 Claims, 11 Drawing Sheets

(51) Int. Cl.

| | |
|---|---|
| ***H01L 29/36*** | (2006.01) |
| ***H01L 29/78*** | (2006.01) |
| ***H01L 29/66*** | (2006.01) |
| *H01L 29/165* | (2006.01) |
| *H01L 29/06* | (2006.01) |

(52) U.S. Cl.
CPC .... *H01L 29/66795* (2013.01); *H01L 29/7848* (2013.01); *H01L 29/7851* (2013.01); *H01L 29/0673* (2013.01); *H01L 29/165* (2013.01)

(58) Field of Classification Search
CPC ........... H01L 21/823821; H01L 21/845; H01L 27/0886; H01L 27/0924; H01L 27/1211; H01L 29/41791; H01L 29/66795
See application file for complete search history.

(56) References Cited

U.S. PATENT DOCUMENTS 8,450,165 B2 * 5/2013 Bohr ..................... H01L 29/045 438/198
8,609,518 B2 * 12/2013 Wann ................ H01L 29/66795 257/E21.09
8,710,632 B2 * 4/2014 Yu ......................... C30B 25/165 257/655
2011/0147828 A1 * 6/2011 Murthy ............. H01L 21/02057 257/327
2013/0234203 A1 * 9/2013 Tsai .................. H01L 29/66795 257/190
2013/0277686 A1 * 10/2013 Liu ..................... H01L 29/6653 257/77
2014/0077279 A1 * 3/2014 Tu ..................... H01L 21/02532 257/288
2015/0357436 A1 * 12/2015 Shen ................. H01L 29/66636 257/190
2016/0155837 A1 * 6/2016 Lee ..................... H01L 29/1608 257/288
2016/0211144 A1 * 7/2016 Lin ................... H01L 21/30608

OTHER PUBLICATIONS

English abstract translation of TW 201445618.
English abstract translation of TW 201411841.
Office action and search report dated Jan. 25, 2017 from the Taiwan Intellectual Property Office for Taiwan application 104137679.

* cited by examiner

LDD-FREE SEMICONDUCTOR STRUCTURE AND MANUFACTURING METHOD OF THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Multiple gate field-effect transistors (MuGFETs) are a recent development in semiconductor technology which typically are metal oxide semiconductor FETs (MOSFETs) that incorporate more than one gate into a single device. The multiple gates may be controlled by a single gate electrode, where the multiple gate surfaces act electrically as a single gate, or by independent gate electrodes. One type of MuGFET is referred to as a FinFET, which is a transistor structure with a fin-like semiconductor channel that is raised vertically out of the semiconductor surface of an integrated circuit.

FinFETs are a relatively new technology in semiconductor devices. Improved design methods, manufacturing methods, and structures to elevate the channel mobility, in terms of reduction of the parasitic resistance, of the FinFET are urgently needed in the art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
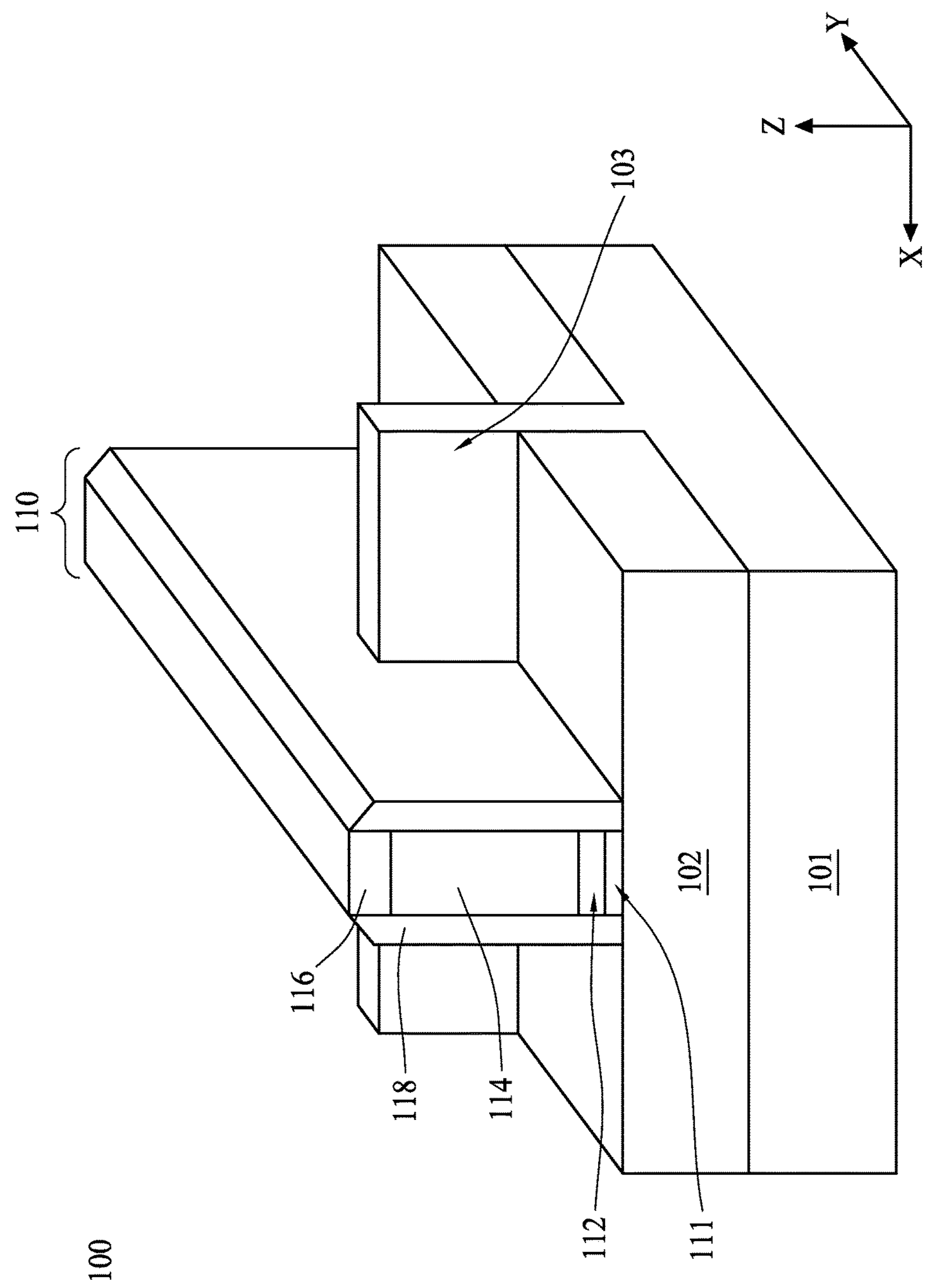
FIG. 1 is a perspective view of an NMOS FinFET without a conventional LDD process.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Because of the complexity inherent in nonplanar devices, such as FinFETs, a number of techniques used in manufacturing planar transistors are not available in manufacturing nonplanar devices. For example, the lightly doped source and drain (LDD) of the FinFET devices causes technical difficulties for the formation processes of FinFET devices. In order to reduce source and drain resistance, small devices demand high source and drain dopant concentrations However, high dopant concentrations, particularly in LDD regions, result in short channel effect (SCE). Other ways to reduce source and drain resistance include extending the LDD regions towards gates of FinFET devices, while the severe shadowing effect limits the LDD dopants from reaching the desired portion under the gate of FinFET devices.

Furthermore, it is also not straightforward to duplicate conventional stress-memorization techniques (SMTs) applied in planar nMOS devices on nonplanar devices for increasing charge mobility through the channel.

The instant invention discloses a lightly doped drain-free (LDD-free) semiconductor structure and associated means. The concept of the present disclosure mainly includes replacing the conventional LDD manufacturing process with a predetermined recipe of a novel epitaxy structure obtained by a regrowth operation, so as to fundamentally mitigate the overall issues mentioned above without introducing further side effects. Greater details are described as follows.

FIG. 1 is a perspective view of an NMOS FinFET 100 without a conventional LDD region. The FinFET 100 includes a substrate 101. The substrate 101 may be a bulk silicon substrate. Alternatively, the substrate 101 may be comprised of an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 202 also include a silicon-on-insulator (SOI) substrate. SOI substrates are fabricated using separation by implantation of oxygen (SIMOX), wafer bonding, and/or other suitable methods.

Some exemplary substrates 101 include an insulator layer. The insulator layer is comprised of any suitable material, including silicon oxide, sapphire, other suitable insulating materials, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET, the insulator layer is a component (e.g., layer) of a silicon-on-insulator substrate.

The substrate 101 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 101, in a P-well structure, in an N-well structure, in a dual-well structure, or using a raised structure. The semiconductor substrate 101 may further include various active regions, such as regions configured for an N-type metal-oxide-semiconductor transistor device and regions configured for a P-type metal-oxide-semiconductor transistor device.

A semiconductor fin structure 103 is formed on the substrate 101. The semiconductor fin 103 is arranged along the X direction. The fin structure 103 is formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure into the silicon layer. Area not protected by the masking element is etched using reactive ion etching (RIE) processes and/or other suitable processes. In an example, the semiconductor fin 103 is formed by patterning and etching a portion of the silicon substrate 101.

In another example, the fin structure 103 is formed by patterning and etching a silicon layer deposited overlying an insulator layer (for example, an upper silicon layer of a silicon-insulator-silicon stack of an SOI substrate). As an alternative to traditional photolithography, the fin structure 103 can be formed by a double-patterning lithography (DPL) process. DPL is a method of constructing a pattern on a substrate by dividing the pattern into two interleaved patterns. DPL allows greater feature (e.g., fin) density. Various DPL methodologies include double exposure (e.g., using two mask sets), forming spacers adjacent features and removing the features to provide a pattern of spacers, resist freezing, and/or other suitable processes. It is understood that multiple parallel fin structures may be formed in a similar manner.

Suitable materials for forming the fin structure 103 include silicon and silicon germanium. In some embodiments, the fin structure 103 includes a capping layer disposed on the fins, such as a silicon capping layer. The fin structure 103 may also include various doped regions. For example, various doped regions can include lightly doped source/drain (LDD) regions and source/drain (S/D) regions (also referred to as heavily doped S/D regions). An implantation process (i.e., a junction implant) is performed to form S/D regions. The implantation process utilizes any suitable doping species. The doping species may depend on the type of device being fabricated, such as an NMOS or PMOS device. For example, the S/D regions are doped with p-type dopants, such as boron or $BF_2$; n-type dopants, such as phosphorus or arsenic; and/or combinations thereof. The S/D regions may include various doping profiles. One or more annealing processes may be performed to activate the S/D regions. The annealing processes include rapid thermal annealing (RTA) and/or laser annealing processes.

Exemplary isolation regions 102 are formed on the substrate 101 to isolate active regions of the substrate 101. The isolation region 102 utilizes isolation technology, such as shallow trench isolation (STI), to define and electrically isolate the various regions. The isolation region 102 includes silicon oxide, silicon nitride, silicon oxynitride, an air gap, other suitable materials, or combinations thereof. The isolation region 102 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide.

One or more gate structures 110 are formed over the substrate 101 in an orthogonal fashion (i.e. along the Y direction) and over a portion of the fin structure 103. The gate structure 110 may be comprised of a gate stack and may include a sealing layer and other suitable structures. The gate stack has an interfacial layer 111, a gate dielectric layer 112, a gate electrode layer 114, and a hard mask layer 116. It is understood that the gate stack may include additional layers such as capping layers, diffusion/barrier layers, dielectric layers, conductive layers, other suitable layers, and/or combinations thereof. The interfacial layer 111 of the gate structure 110 is formed over the substrate 101 and fin structure 103. The interfacial layer 111 is formed by any suitable process to any suitable thickness. An exemplary interfacial layer 111 includes silicon oxide (e.g., thermal oxide or chemical oxide) and/or silicon oxynitride (SiON).

The gate dielectric layer 112 is formed over the interfacial layer 111 by any suitable process. The gate dielectric layer 112 may be comprised of a dielectric material, such as silicon oxide, silicon nitride, silicon oxynitride, high-k dielectric material, other suitable dielectric material, and/or combinations thereof. Examples of high-k dielectric material includes HfO2, HfSiO, HfSiON, HfTaO, HfSiO, HfZrO, zirconium oxide, aluminum oxide, hafnium dioxide-alumina (HfO2-Al2O3) alloy, other suitable high-k dielectric materials, and/or combinations thereof.

The gate electrode layer 114 is formed over the gate dielectric layer 112 by any suitable process. The gate electrode layer 114 includes any suitable material, such as polysilicon, aluminum, copper, titanium, tantulum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The hard mask layer 116 is formed over the gate electrode layer 114 by any suitable process. The hard mask layer 116 may be comprised of any suitable material, for example, silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, and/or other suitable material.

The gate stack of the gate structure 110 is formed by any suitable process or processes. For example, the gate stack can be formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion-beam writing. The etching processes include dry etching, wet etching, and/or other etching methods (e.g., reactive ion etching).

The gate structure 110 may further include a gate spacer 118. The gate spacers 118, which are positioned on each side of the gate stack (on the sidewalls of the gate stack), may be comprised of a dielectric material, such as silicon nitride, silicon carbide, silicon oxynitride, other suitable materials, and/or combinations thereof. In some embodiments, the gate spacers 118 are used to offset subsequently formed doped regions, such as source/drain regions. The gate spacers 118 may further be used for designing or modifying the source/drain region (junction) profile.

Further, unlike normal planar or nonplanar MOS devices, the NMOS FinFET 100 is produced without an LDD structure formed between the source/drain region and the gate. Specifically, an epitaxy structure is employed to preserve the advantages of the conventional LDD design but exclude the drawbacks. By way of introducing the manufacturing method, the benefit gained from the LDD-free structure will be set forth as below compared with the convention LDD structure.

Figure 2:
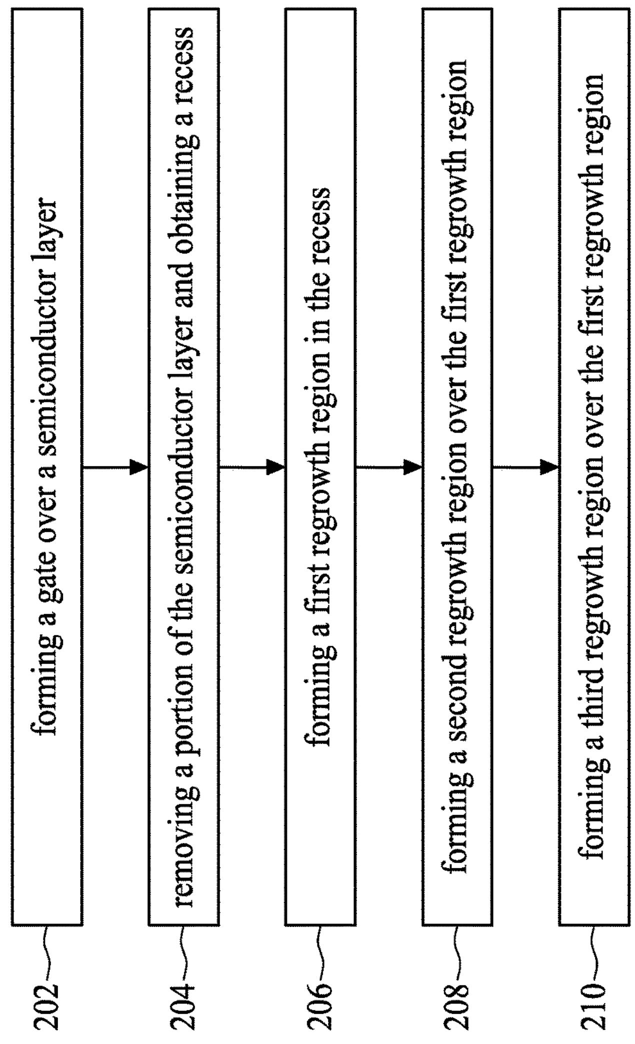
FIG. 2 is an operational flowchart of a method for manufacturing an LDD-free semiconductor structure according to an exemplary embodiment of the disclosure.

FIG. 2 is an operational flowchart of a method for manufacturing an LDD-free semiconductor structure according to an exemplary embodiment of the disclosure. According to an operation 202, first of all, the gate structure 110 is formed over a semiconductor layer (i.e. the semiconductor fin 103) depicted in FIG. 1 as described in the preceding paragraphs. The operation 202 is regarded as a lead foundation of the disclosure. In the following, a portion of the semiconductor fin 103 is removed to obtain a recess region according to an operation 204 of the operational flow.

Figure 3:
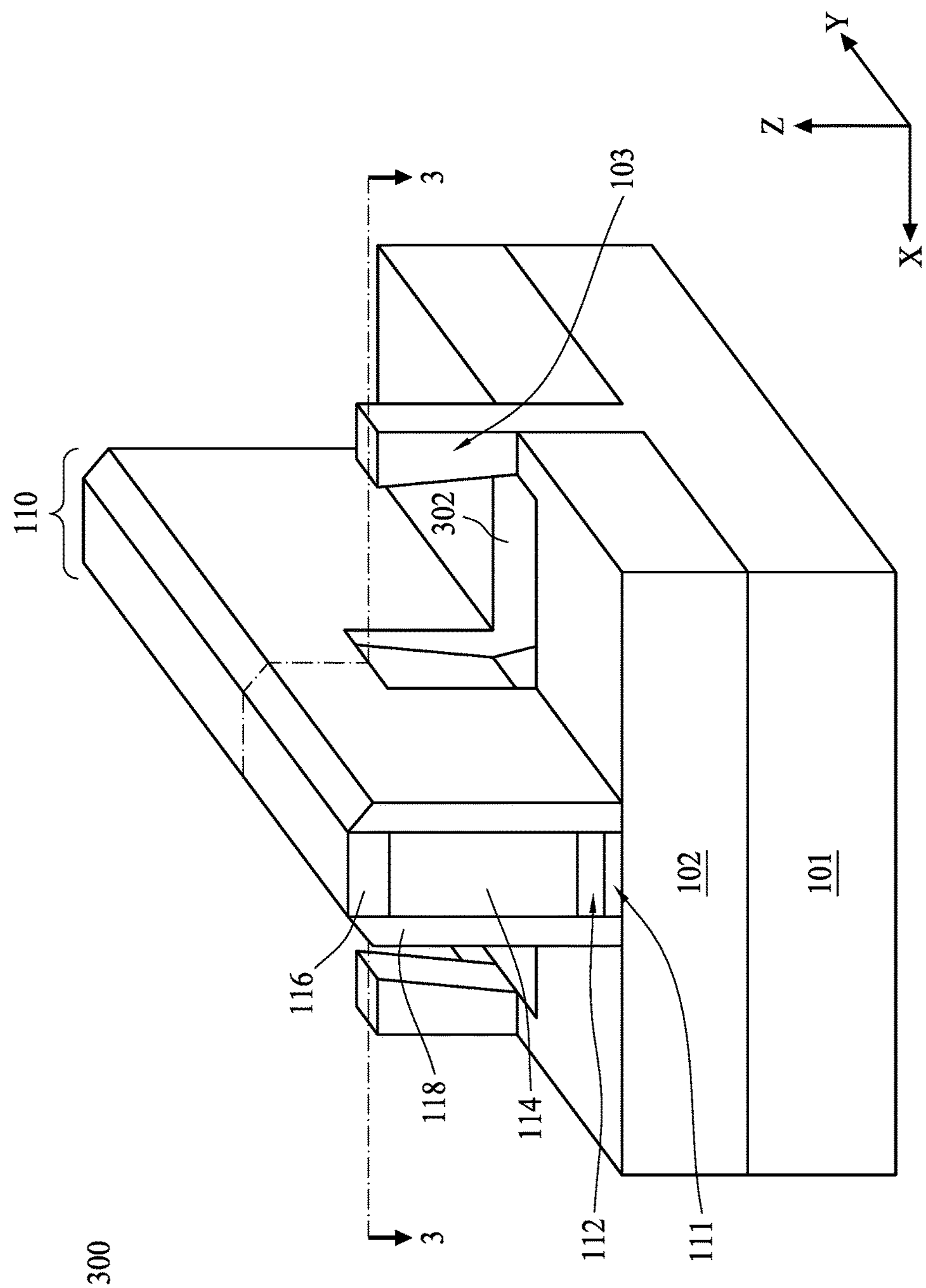
FIG. 3 is a perspective view of an NMOS FinFET with a recess produced from the FinFET according to an embodiment of the disclosure.

FIG. 3 is a perspective view of an NMOS FinFET 300 with a recess 302 produced from the FinFET 100 according to an embodiment of the disclosure. Any suitable amount of material may be removed from the semiconductor fin 103, the isolation regions 102 or the substrate 101. However, the amount of the recess 302 removed can be tailored by controlling etching conditions, that is, the depth of the recess 302 is controllable by applying different etchant at various etching conditions. In the depicted embodiment shown in FIG. 3, the recess 302 is obtained by removing a predetermined portion of the semiconductor fin 103. With respect to an aspect of the X direction, the recess 302 may extend from the gate spacers 118 of the metal gates 110 towards a direction away from the metal gates 110 at a predetermined length. The length may be determined based on the dimensions of the source/drain regions in normal cases according to practical design considerations and the manufacturing process adopted, and is not a limitation of the disclosure. With respect to an aspect of the Y direction, the recess 302 may include merely the FinFET 103; or alternatively, the recess 302 may further extend to include a portion of the isolation regions 102. With respect to an aspect of the Z direction, the recess 302 may extend to the substrate 101.

Figure 4:
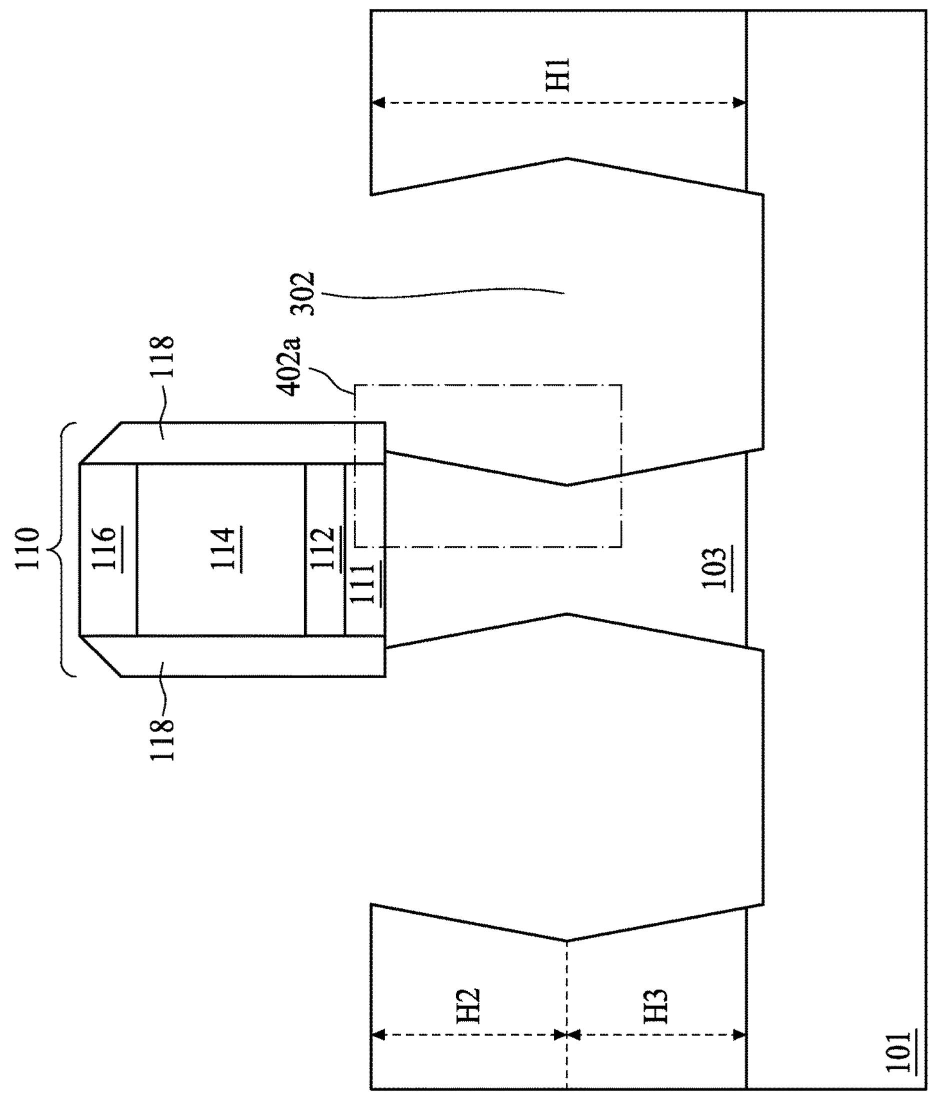
FIG. 4 is a cross-sectional view of the NMOS FinFET taken along the lines 3-3 of FIG. 3.
Figure 5:
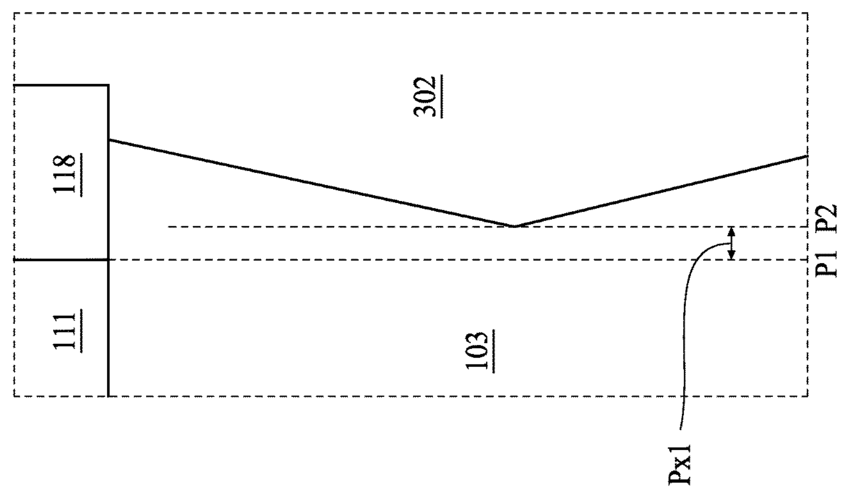
FIG. 5 is a partially enlarged cross-sectional view of the dotted box "402*a*" of FIG. 4.
Figure 6:
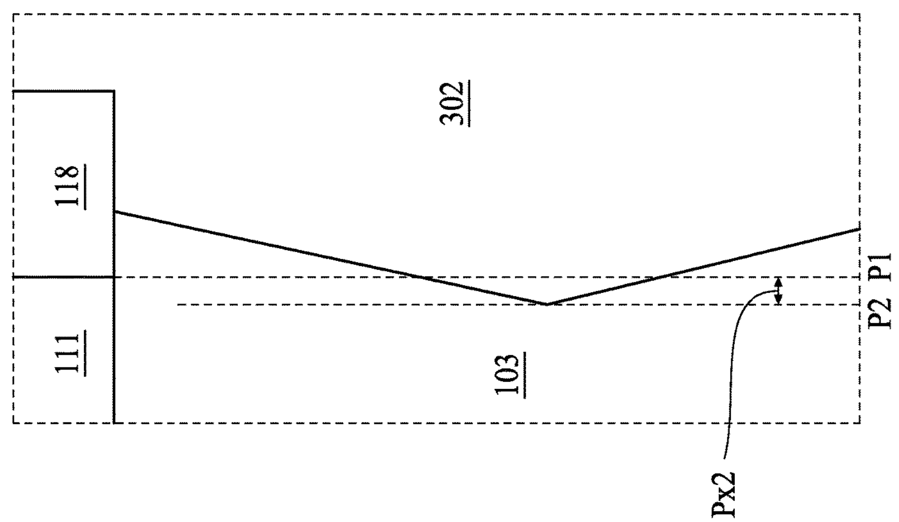
FIG. 6 is another partially enlarged cross-sectional view of the dotted box "402*a*" of FIG. 4.

FIG. 4 is a cross-sectional view of the NMOS FinFET 300 taken along the lines 3-3 of FIG. 3. In this way, elements to be discussed can be expressly shown for the purpose of clarity. A height H1 of the fin 103 is noted in FIG. 4; further, a height H2 of the channel of the FinFET 300 marks the height protruding from the top surface of the isolation regions 102; and the remaining part of the fin 103 of a height H3 is beneath the top surface of the isolation regions 102. The profile of the recess 302 may be a convex polygon and extend toward a region beneath the gate spacer 118 and close to a plane P1 extending along a junction of the gate spacer 118 and the gate electrode layer 114 as depicted in FIGS. 5-6. FIG. 5 is a partially enlarged cross-sectional view of the dotted box "402*a*" of FIG. 4. A tangent plane P2 of the recess 302 is located right below the gate spacers 118. According to FIG. 5, a distance P×1 between the tangent plane P2 and the extending plane P1 may be from about 0 nm to about 7 nm FIG. 6 is another partially enlarged cross-sectional view of the dotted box "402*a*" of FIG. 4. In FIG. 6, the tangent plane P2 may further extend toward the gate electrode layer 114 side and located under the gate electrode layer 114. A distance P×2 between the tangent plane P2 and the extending plane P1 may be from about 0 nm to about 1 nm. Hereinafter, the distance P×1 is denoted with a positive sign, and the distance P×2 is denoted with a negative sign. In short, the recess 302 in which a regrowth region will be form provides a proximity value of from about 7 nm to about −1 nm. However, these are not limitations of the present disclosure. In some embodiment, the profile of the recess 302 may be different from FIG. 4.

Compared with the conventional design, the proximity value of the FinFET 300 is aggressively reduced from the structural standpoint. One of the resultant consequences is the reduction of the proximity value may introduce short channel effect. By way of predetermined doping process which will be discussed below, the instant disclosure is capable of overcoming the short channel effect when taking advantages of this near zero proximity value to minimize the parasitic resistance Rp. Please note that the FinFET 300, nevertheless, is a single-fin MOS, it should be understood the present disclosure can also be applied to FinFETs with multiple parallel fin structures in a similar manner.

The removing operation 204 may include forming a photoresist layer or a capping layer (such as an oxide capping layer) over the NMOS FinFET 100, patterning the photoresist or capping layer to have openings that expose the S/D regions of the FinFET 100, and etching back material from the semiconductor fin 103 and down to the substrate 101. The FinFET 300 is etched by an anisotropic etching process followed by an isotropic etching process. In some embodiments, the etching process may employ another etching process, and this is not a limitation of the disclosure. For example, the removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process may be implemented or replaced by other methods, such as maskless photolithography, electron-beam writing, and ion-beam writing. In yet another alternative, the lithography process could implement nanoimprint technology.

Figure 7:
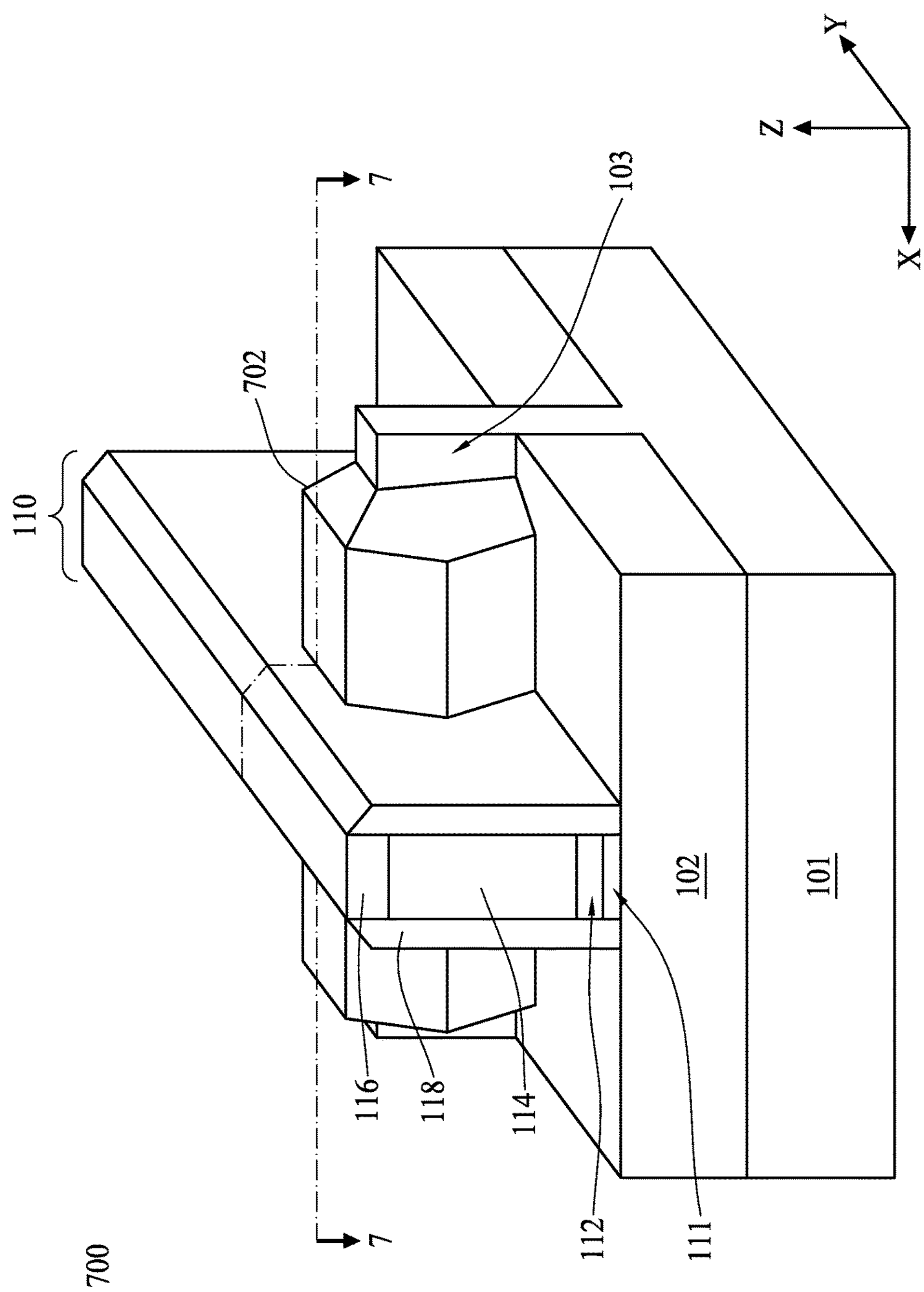
FIG. 7 is a perspective view of an NMOS FinFET with a regrowth region according to an embodiment of the disclosure.
Figure 8:
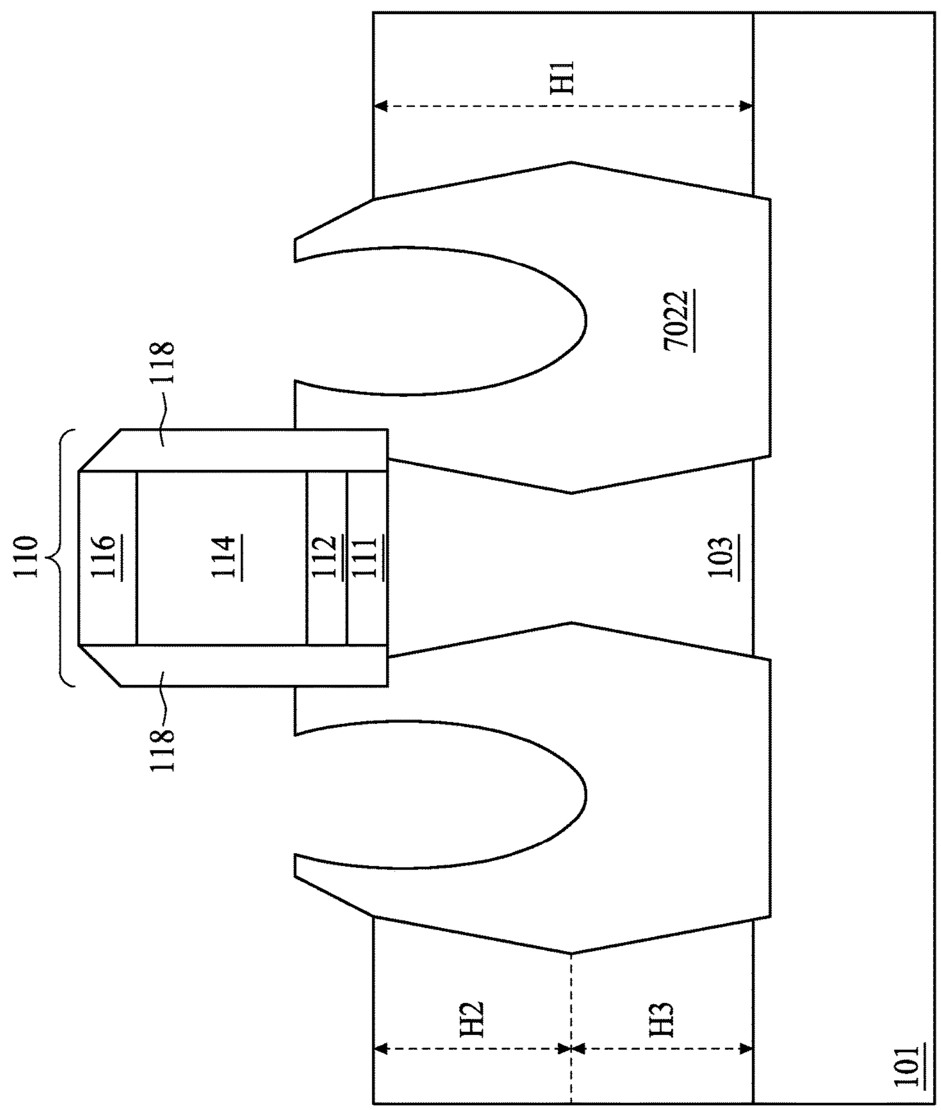
FIGS. 8-10 are cross-sectional views illustrating an operational flow of forming a regrowth region.
Figure 9:
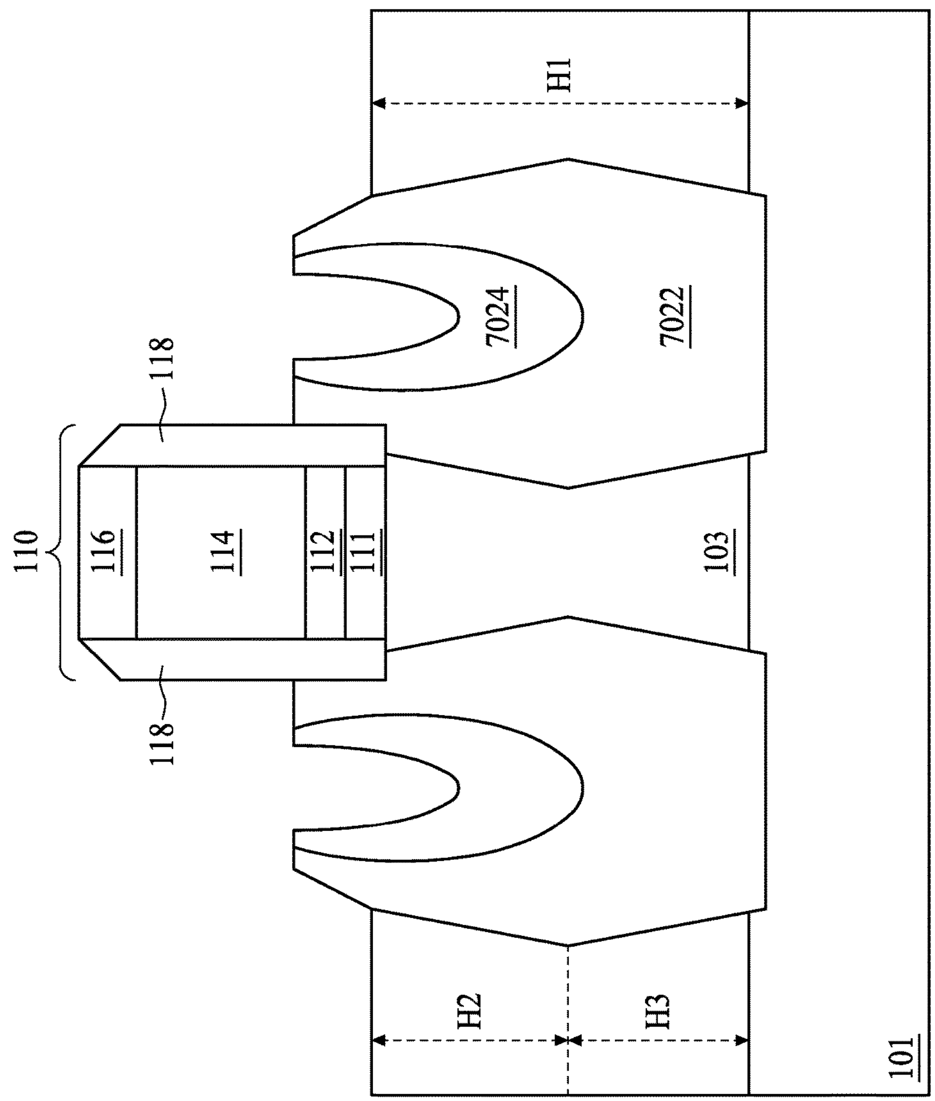
Figure 10:
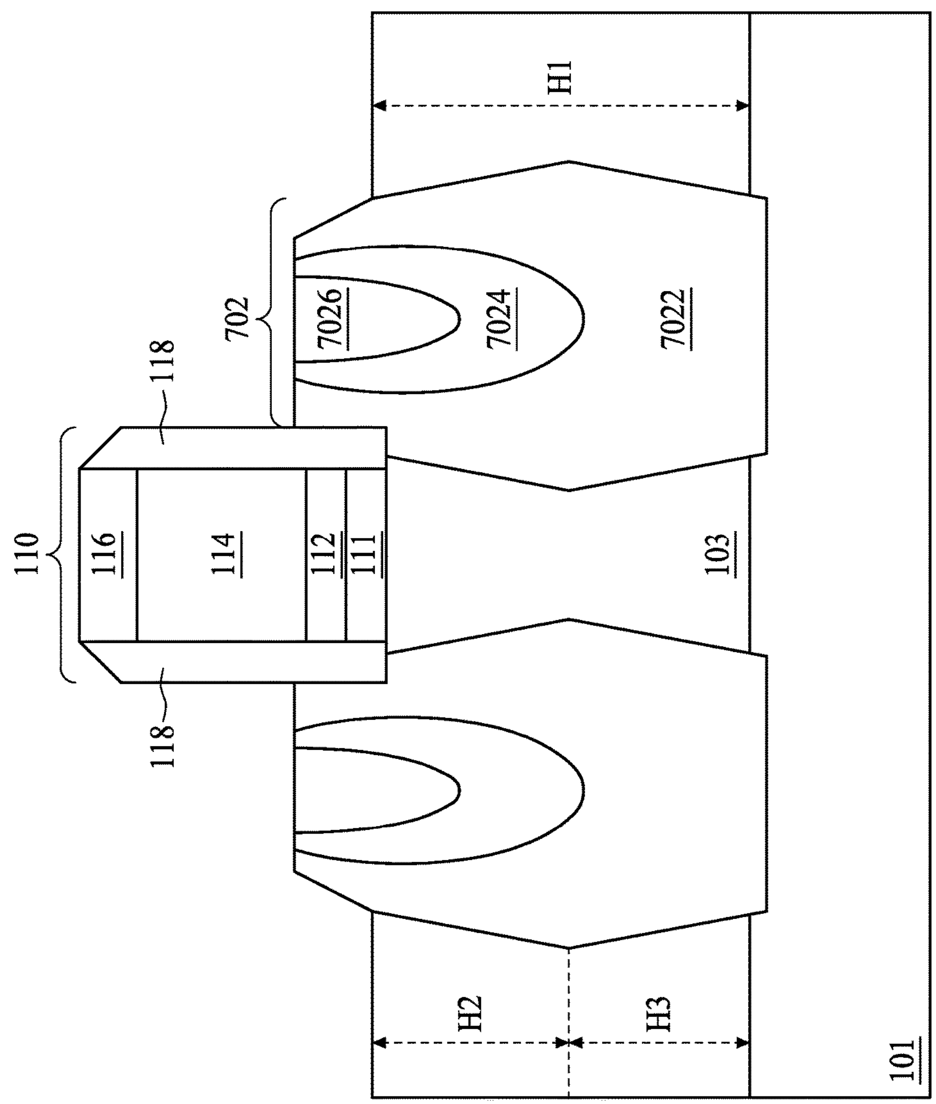

FIG. 7 is a perspective view of an NMOS FinFET 700 with a regrowth region 702 according to an embodiment of the disclosure. In order to facilitate the ensuing discussion, please refer to FIG. 7 in conjunction with FIGS. 8-10. FIGS. 8-10 are cross-sectional views illustrating an operational flow of forming a regrowth region 702. In this way, the interior structure of the regrowth region 502 can be expressly shown for the purpose of clarity.

The FinFET 700 is produced by generating the regrowth region 702 at the recess 302 of the FinFET 300, wherein the regrowth region 702 including a first regrowth region 7022, a second regrowth region 7024 and a third regrowth region 7026. Specifically, the regrowth region 702 as a whole is formed as S/D regions of the FinFET 700. The three layers of the regrowth region 702, i.e. the first regrowth region 7022, the second regrowth region 7024 and the third regrowth region 7026, may be formed by one or more epitaxy or epitaxial (epi) operations, such as phosphor-doped or boron-doped silicon regrowth layer, SiGe regrowth layer, SiC regrowth layer, phosphor-doped or boron-doped SiC regrowth layer, pseudocubic $Si_3P_4$ regrowth layer, and/or other suitable regrowth layer that can be formed in a crystalline state on the NMOS FinFET transistor. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the first semiconductor layer or the substrate 101 of the planar transistor.

As illustrated in FIG. 8, the first regrowth region 7022, as a bottom layer, formed preceding to the formation of the other regrowth region, may be a conformal epitaxial phosphor-doped silicon carbide layer, or SiC:P. In some embodiments, the first regrowth region 7022 may be irregular shaped without conformality. When forming the first regrowth region 7022 in the recess as mentioned in an operation 206, the thickness of the first regrowth region 7022 may be from about 5 nm to about 15 nm; however, the range of first regrowth region thickness shall not be deemed as a limiting feature. Due to a nearly zero proximity value, the first regrowth region 7022 may function as an LDD doping region. It should be noted that the nearly zero proximity value of the instant disclosure represents that the dopants further reach a region underneath the gate 110, and said region cannot be accessed by the dopant under the conventional LDD implantation scheme.

One of the consideration when achieving the near zero proximity value is to tailor an appropriate carbon dopant concentration in the first regrowth region 7022, in order to mitigate phosphorus out-diffusion. Normally, phosphorus is incorporated into source and drain regions of an N-type transistor. To mitigate phosphorus out-diffusion, carbon atoms is introduced into the source and drain regions. The carbon acts as a gettering agent for phosphorus interstitials that have a tendency to diffuse. In this manner, the highly active phosphorus can be desirably implanted while the carbon facilitates maintaining substantially abrupt source/drain junctions. In some embodiments, the first regrowth region 7022 possesses a substitutional carbon dopant concentration greater than about 1%; in other embodiments, the first regrowth region 7022 possesses a carbon dopant concentration of from about 1% to about 4%; however, this is not a limitation of the present disclosure.

The increase of the carbon dopant concentration correspondingly occupies the lattice sites of a portion of the phosphorous thus the phosphorous concentration is reduced. In some embodiments, the first regrowth region 7022 possesses a phosphorus dopant concentration of from about 1E19 to about 3E20 atoms/$cm^3$; however, this is not a limitation of the disclosure. Since the carbon dopant has a characteristic of retarding the phosphorous diffusion as mentioned above, the increase of the carbon dopant concentration and the decrease of the phosphorous dopant concentration significantly suppress the out-diffusion from the first regrowth region 7022 to the neighboring layers including the channel region. The short channel effect therefore can be alleviated as a result of introducing a sufficient amount of carbon into the first regrowth region 7022.

Further, the carbon may produce a tensile stress within the substrate that may further enhance carrier mobility and lower channel resistance. In this embodiment, substituting the carbon dopant for a small portion of the phosphorous dopant further provides tensile stress to the channel of the NMOS FinFET 700. The tensile stress is contributed from minor lattice mismatches between the carbon and silicon atoms. The extra strain to the channel can effectively increase the carrier mobility and hence the device performance. In summary, the first regrowth region 7022 is not only a layer to functionally work like the conventional LDD region under the gate spacers 118, but also a layer to prevent short channel effect. In addition, the first regrowth region 7022 can be a stressor buffer layer for mobility boost. In short, the first regrowth region 7022 solves the fundamental NMOS FinFET LDD implantation issue caused by the shadowing effect but not at the expense of inducing short channel effect.

After the first regrowth region 7022 is formed, an operation 208 of FIG. 2 is performed to form the second regrowth region 7024 over the underlying first regrowth region 7022. In this embodiment, the second regrowth region 7024 is partially surrounded by the first regrowth region 7022. The second regrowth region 7024, as a second layer above the bottom layer, may be a conformal epitaxy phosphorous-doped silicon carbide layer, or SiC:P. In some embodiments, the second regrowth region 7024 may be irregular shaped without conformality. When forming the second regrowth region 7024 in the recess as mentioned in the operation 208, the thickness of the second regrowth region 7024 may be in a range of from about 25 nm to about 35 nm; however, it is not a limitation.

Due to the second regrowth region 7024 is partially surrounded by the first regrowth region 7022, the second regrowth region 7024 is distanced from the channel and becomes insensitive to the short channel effect compared to the outer first regrowth region 7022. That being the case, a phosphorus dopant concentration in the second regrowth region 7024 may be increased to an extent greater that of the first regrowth region 7022, in order to further lowering the source and drain resistance $R_{SD}$ and retaining a sufficient carbon dopant concentration considering the overall strain to the channel region. Generally, the phosphorus concentration in the second regrowth region 7024 is greater than the phosphorus concentration in the first regrowth region 7022; or on the other hand, the carbon concentration in the first regrowth region 7022 is greater than the carbon concentration in the second regrowth region 7024. In some embodiments, the second regrowth region 7024 possesses a phosphorus dopant concentration of from about 1E20 to about 2E20 atoms/$cm^3$. In some embodiments, the second regrowth region 7024 possesses a substitutional carbon dopant concentration of from about 1.2% to about 2.5%. However, this is not a limitation of the present disclosure.

After the second regrowth region 7024 is formed, an operation 210 of FIG. 2 is performed to form the third regrowth region 7026 over the second regrowth region 7024. In this embodiment, the third regrowth region 7026 is partially surrounded by the second regrowth region 7024. The third regrowth region 7026 may be a conformal epitaxy phosphor-doped silicon, or pseudocubic $Si_3P_4$. In some embodiments, the third regrowth region 7026 may be irregular shaped without conformality. When forming the third regrowth region 7026 in the recess as mentioned in operation 210, the thickness of the third regrowth region 7026 may be in a range of from about 2 nm to about 10 nm; however, it is not a limitation.

Figure 11:
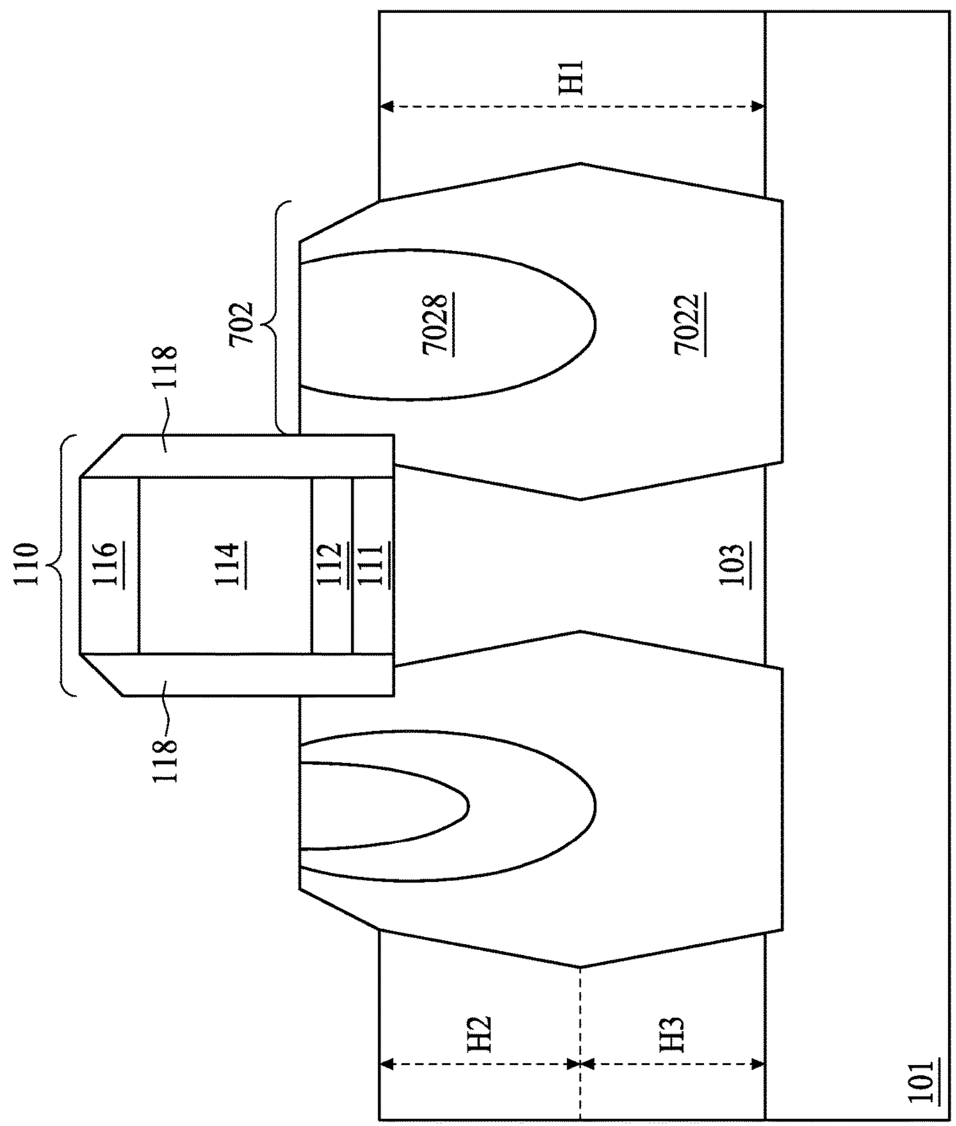
FIG. 11 is a cross-sectional view taken along the lines 7-7 of FIG. 7.

Since the third regrowth region 7026 is much more insensitive to the short channel effect compared to the outer first and second regrowth regions 7022 and 7024. Carbon dopant may be omitted and the phosphorus dopant concentration may be greater than both the first and second regrowth regions 7022 and 7024. The pseudocubic $Si_3P_4$ of the third regrowth region 7026 helps to provide strain for source/drain resistance Rsd reduction and therefore the overall parasitic resistance Rp can be reduced as well. Please note that the configuration of the three regrowth layers may be modified according to practical design considerations. For example, FIG. 11 is a cross-sectional view for illustrating the regrowth region 702 of the FinFET 700 taken along the lines 7-7 of FIG. 7. Referring to FIG. 10 and FIG. 11, in some embodiments, the second regrowth region 7024 may be omitted and directly replaced by the third regrowth region 7026. In some embodiments, the third regrowth region 7026 may be omitted and directly replaced by the second regrowth region 7024. In other words, the three-layer architecture may be altered to a two-layer configuration comprised of merely the first regrowth region 7022 and another regrowth region 7028. As long as the arrangement or architecture is not deviated from the central idea of the disclosed concept, any other combination of the three or more or less layers also falls within the scope of the present disclosure.

Please note that the regrowth region 702 with an elevated body protruding from the semiconductor fin structure 103 is not a limitation of the present disclosure. In some embodiments, the regrowth region 702 including the first regrowth region 7022, the second regrowth region 7024 and the third regrowth region 7026 as a whole may be substantially coplanar with the surface of the fin structure 103. In some embodiments, the regrowth region 702 may be recessed from the surface of the fin structure 103. Furthermore, the present disclosure is not limited to FinFET devices. In some embodiments, the LDD-free semiconductor structure and manufacturing method may be also applied to planar NMOS devices with appropriate modifications.

Some embodiments of the present disclosure provide a lightly doped drain-free (LDD-free) semiconductor structure including a semiconductor layer, a gate over the semiconductor layer and a regrowth region made of semiconductor material positioned in the semiconductor layer, and the regrowth region forms a source region or a drain region of the LDD-free semiconductor structure. The gate comprises a gate electrode layer laterally covered by a gate spacer, and the regrowth region extends towards a region beneath the gate spacer and close to a plane extending along a junction of the gate spacer and the gate electrode layer.

In some embodiments of the present disclosure, the regrowth region includes a first regrowth region and a second regrowth region, and the first regrowth region partially surrounds the second regrowth region.

In some embodiments of the present disclosure, the first regrowth region includes phosphor-doped silicon carbide.

In some embodiments of the present disclosure, the second regrowth region includes phosphor-doped silicon.

In some embodiments of the present disclosure, the second regrowth region includes phosphor-doped silicon carbide.

In some embodiments of the present disclosure, the regrowth region further includes a third regrowth region at least partially surrounded by the second regrowth region.

In some embodiments of the present disclosure, the third regrowth region includes phosphor-doped silicon.

In some embodiments of the present disclosure, the regrowth region provides a proximity value of from about 7 nm to about −1 nm.

In some embodiments of the present disclosure, the first regrowth region possesses a phosphorus dopant concentration of from about 1E19 to about 3E20 atoms/$cm^3$.

In some embodiments of the present disclosure, the first regrowth region possesses a carbon dopant concentration of from about 1% to about 4%.

In some embodiments of the present disclosure, the second regrowth region possesses a phosphorus dopant concentration of from about 1E20 to about 2E20 atoms/$cm^3$.

In some embodiments of the present disclosure, the second regrowth region possesses a carbon dopant concentration of from about 1.2% to about 2.5%.

In some embodiments of the present disclosure, the third regrowth region possesses a phosphorus dopant concentration of from about 2E21 to about 5E21 atoms/$cm^3$.

Some embodiments of the present disclosure provide a lightly doped drain-free (LDD-free) semiconductor structure including a semiconductor fin, a gate over the semiconductor fin and a regrowth region made of semiconductor material positioned in the semiconductor fin, and the regrowth region forms a source region or a drain region of the LDD-free semiconductor structure. The LDD-free semiconductor structure is a FinFET, the gate comprises a gate electrode layer laterally covered by a gate spacer, and the regrowth region extends towards a region beneath the gate spacer and close to a plane extending along a junction of the gate spacer and the gate electrode layer.

In some embodiments of the present disclosure, the regrowth region includes a first regrowth region and a second regrowth region, and the first regrowth region partially surrounds the second regrowth region.

In some embodiments of the present disclosure, a phosphorus concentration in the second regrowth region is greater than a phosphorus concentration in the first regrowth region.

In some embodiments of the present disclosure, a carbon concentration in the first regrowth region is greater than a carbon concentration in the second regrowth region.

Some embodiments of the present disclosure provide a method for manufacturing a lightly doped drain-free (LDD-free) semiconductor structure. The method includes forming a gate over a semiconductor layer, removing a portion of the semiconductor layer and obtaining a recess, and forming a regrowth region over the recess. The gate includes a gate electrode layer laterally covered by a gate spacer, and the regrowth region extends towards a region beneath the gate spacer and close to a plane extending along a junction of the gate spacer and the gate electrode layer.

In some embodiments of the present disclosure, forming the regrowth region over the recess includes forming a first regrowth region in the recess, and forming a second regrowth region over the first regrowth region. The first regrowth region partially surrounds the second regrowth region.

In some embodiments of the present disclosure, the LDD-free semiconductor structure is a FinFET, and the semiconductor layer is a semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lightly doped drain-free (LDD-free) semiconductor structure, comprising:

- an isolation layer having a top surface;
- a semiconductor layer in the isolation layer and protruding from the top surface of the isolation layer;
- a gate over the semiconductor layer and the isolation layer; and
- a regrowth region made of semiconductor material positioned in the semiconductor layer, and the regrowth region forming a source region or a drain region of the LDD-free semiconductor structure;
- wherein the gate comprises a gate electrode layer laterally covered by a gate spacer, and the regrowth region comprises a first regrowth region and a second regrowth region; and
- the first regrowth region partially surrounds the second regrowth region; and
- the second regrowth region is free from contacting the gate spacer;
- wherein the first regrowth region includes a convex vertex extending towards a region beneath the gate spacer and close to a plane extending along a junction of the gate spacer and the gate electrode layer; and the convex vertex is at the same level as the top surface of the isolation region.

2. The LDD-free semiconductor structure of claim 1, wherein the first regrowth region comprises phosphor-doped silicon carbide.

3. The LDD-free semiconductor structure of claim 1, wherein the second regrowth region comprises phosphor-doped silicon.

4. The LDD-free semiconductor structure of claim 1, wherein the second regrowth region comprises phosphor-doped silicon carbide.

5. The LDD-free semiconductor structure of claim 1, wherein the regrowth region further comprises a third regrowth region at least partially surrounded by the second regrowth region.

6. The LDD-free semiconductor structure of claim 5, wherein the third regrowth region comprises phosphor-doped silicon.

7. The LDD-free semiconductor structure of claim 1, wherein the regrowth region provides a proximity value of from about 7 nm to about −1 nm.

8. The LDD-free semiconductor structure of claim 2, wherein the first regrowth region possesses a phosphorus dopant concentration of from about 1E19 to about 3E20 atoms/cm$^3$.

9. The LDD-free semiconductor structure of claim 2, wherein the first regrowth region possesses a substitutional carbon dopant concentration of from about 1% to about 4%.

10. The LDD-free semiconductor structure of claim 4, wherein the second regrowth region possesses a phosphorus dopant concentration of from about 1E20 to about 2E20 atoms/cm$^3$.

11. The LDD-free semiconductor structure of claim 4, wherein the second regrowth region possesses a substitutional carbon dopant concentration of from about 1.2% to about 2.5%.

12. The LDD-free semiconductor structure of claim 5, wherein the third regrowth region possesses a phosphorus dopant concentration of from about 2E21 to about 5E21 atoms/cm$^3$.

13. A lightly doped drain-free (LDD-free) semiconductor structure, comprising:

- an isolation layer having a top surface;
- a semiconductor fin in the isolation layer and protruding from the top surface of the isolation layer;
- a gate over the semiconductor fin and the isolation layer; and
- a regrowth region made of semiconductor material positioned in the semiconductor fin, and the regrowth region forming a source region or a drain region of the LDD-free semiconductor structure;
- wherein the LDD-free semiconductor structure is a FinFET, the gate comprises a gate electrode layer laterally covered by a gate spacer; and
- the regrowth region comprises a first regrowth region and a second regrowth region, and the first regrowth region partially surrounds the second regrowth region; and
- the second regrowth region is free from contacting the gate spacer;
- wherein the first regrowth region includes a convex vertex extending towards a region beneath the gate spacer and close to a plane extending along a junction of the gate spacer and the gate electrode layer; and the convex vertex is at the same level as the top surface of the isolation region.

14. The LDD-free semiconductor structure of claim 13, wherein a phosphorus concentration in the second regrowth region is greater than a phosphorus concentration in the first regrowth region.

15. The LDD-free semiconductor structure of claim 13, wherein a carbon concentration in the first regrowth region is greater than a carbon concentration in the second regrowth region.

16. A lightly doped drain-free (LDD-free) semiconductor structure, comprising:

an isolation layer having a top surface;

a semiconductor fin in the isolation layer and protruding from the top surface of the isolation layer;

a gate over the semiconductor fin and the isolation layer; and a source/drain region positioned in the semiconductor fin;

wherein the LDD-free semiconductor structure is a FinFET, the gate comprises a gate electrode layer laterally covered by a gate spacer, and the source/drain region; and the source/drain region comprises a first regrowth region and a second regrowth region, and the first regrowth region partially surrounds the second regrowth region; and the second regrowth region is free from contacting the gate spacer;

wherein the first regrowth region includes a convex vertex extending towards a region beneath the gate spacer and close to a plane extending along a junction of the gate spacer and the gate electrode layer; and the convex vertex overlaps is at the same level as the top surface of the isolation region.

17. The LDD-free semiconductor structure of claim 16, wherein the source/drain region further comprises a third regrowth region at least partially surrounded by the second regrowth region.

* * * * *